(12) United States Patent
Nguyen

(10) Patent No.: US 6,958,679 B1
(45) Date of Patent: Oct. 25, 2005

(54) BINARY HYSTERESIS EQUAL COMPARATOR CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 79 days.

(21) Appl. No.: 10/772,686

(22) Filed: Feb. 5, 2004

(51) Int. Cl.$^7$ .............................................. G05B 1/00
(52) U.S. Cl. ................................................. 340/146.2
(58) Field of Search ..................... 340/146.2; 327/205, 327/206

(56) References Cited

U.S. PATENT DOCUMENTS

| | | |
|---|---|---|
| RE34,808 E | 12/1994 | Hsich |
| 6,366,136 B1 * | 4/2002 | Page ............................ 327/53 |
| 6,894,542 B2 * | 5/2005 | Prexl et al. .................... 327/67 |

* cited by examiner

Primary Examiner—Margaret R. Wambach
(74) Attorney, Agent, or Firm—Lois D. Cartier

(57) ABSTRACT

Binary hysteresis equal comparator circuits and methods. An equal comparator does not indicate an equal condition until the two binary input values are exactly the same. However, after the two binary input values first become equal, a window of variation comes into effect, within which the first of the two values is allowed to vary while the circuit continues to report an equal condition. This window can extend only above the equal condition, only below the equal condition, or both above and below the equal condition. The width of the window is determined by providing one or two predetermined constant values, a first constant defining the amount of hysteresis provided above the second value, and a second constant defining the amount of hysteresis provided below the second value. Related methods are also described of performing equal comparisons while providing binary hysteresis.

41 Claims, 9 Drawing Sheets

US 6,958,679 B1

BINARY HYSTERESIS EQUAL COMPARATOR CIRCUITS AND METHODS

FIELD OF THE INVENTION

The invention relates to digital circuits that provide hysteresis. More particularly, the invention relates to equal comparator circuits providing binary hysteresis.

BACKGROUND OF THE INVENTION

The term "hysteresis" generally refers to the process of compensating for variations (e.g., "noise") in an input signal by adjusting the point at which a system reacts to the input signal. For example, in electrical circuits a rising signal can be detected at a first and higher voltage level (the "rising edge trip point"), while a falling signal can be detected at a second and lower voltage level (the "falling edge trip point"). FIGS. 1–3 are waveform diagrams that can be used to describe this type of hysteresis, which is referred to herein as "level hysteresis".

FIG. 1 illustrates the process of an ideally clean input signal IN rising and falling, and its effect on an output signal OUT of inverter 101. Input signal IN rises linearly from a low value (e.g., a ground value) to a high value (e.g., power high VDD). Half-way through the rising edge, at time Tr, the voltage level on signal IN reaches the trip point tp and inverter 101 is triggered. Thus, the output signal OUT from inverter 101 begins to fall. Signal OUT also falls linearly in this ideal circuit, from the high value to the low value. After a time, input signal IN changes state again, falling linearly from the high value to the low value. Half-way through the falling edge, at time Tf, the voltage level on signal IN reaches the trip point tp and inverter 101 is triggered. Thus, the output signal OUT from inverter 101 begins to rise. Signal OUT also rises linearly in this ideal circuit, from the low value to the high value. Thus, signal OUT is a noise-free output signal ideally suited to drive other circuitry.

FIG. 2 illustrates what happens to the idealized signals of FIG. 1 in a noisy signal environment. Both the rising and falling edges of signal IN are subject to sudden alterations that can momentarily cause the signal to rise above, then fall below, the trip point tp. Each time input signal IN rises above the trip point (e.g., at times T1, T3, and T5), output signal OUT changes from the high value to the low value. Each time input signal IN falls below the trip point (e.g., at times T2, T4, and T6), output signal OUT changes from the low value to the high value. The result is a noisy output signal OUT, as shown in FIG. 2.

FIG. 3 illustrates the resulting waveforms when inverter 101 is replaced by a Schmitt trigger 301. Schmitt triggers are well known. For example, one Schmitt trigger is described by Hsieh in U.S. Reissue Patent No. Re. 34,808, "TTL/ CMOS Compatible Input Buffer with Schmitt Trigger", which is incorporated herein by reference. A Schmitt trigger provides level hysteresis in the manner previously described, by providing different trip points for the rising and falling edges of the input signal. The rising edge trip point tpr is higher than the falling edge trip point tpf. Thus, the brief and limited negative movements in voltage level during the rising edge of input signal IN do not cause the output signal OUT to rise to the high value. Similarly, the brief and limited positive movements in voltage level during the falling edge of input signal IN do not cause the output signal OUT to fall to the low value. Hence, the circuit of FIG. 3 is noise-immune, provided the extent of the noise does not exceed the protection provided by the difference in trip-points.

Schmitt triggers can be very useful, when they are available. However, they do have their drawbacks in some applications. For example, Schmitt triggers are analog circuits that cannot readily be implemented in the digital programmable logic generally available in programmable logic devices (PLDs). PLDs typically provide arrays of digital logic elements that can be programmed to assume various configurations performing desired digital functions. However, analog functions typically cannot be implemented in a PLD unless they are deliberately included in the fabric of the PLD by the PLD designer and manufacturer.

Therefore, it is desirable to provide digital circuits and methods of providing hysteresis, e.g., hysteresis circuits and methods that can be implemented in digital PLDs.

SUMMARY OF THE INVENTION

The invention provides binary hysteresis equal comparator circuits and methods. An equal comparator according to the present invention does not indicate an equal condition until the two binary input values are exactly the same. However, after the two binary input values first become exactly equal, a window of variation comes into effect, within which the first of the two values is allowed to vary while the circuit continues to report an equal condition. The window of allowable variation provides hysteresis to the first binary input value. This window can extend only above the equal condition, only below the equal condition, or both above and below the equal condition. The width of the window is determined by providing one or two predetermined constant values, a first predetermined constant defining the amount of hysteresis provided above the second value, and a second predetermined constant defining the amount of hysteresis provided below the second value. In some embodiments, the two constants are the same, e.g., a single constant is used to perform both functions. Further, because the equal comparator is evaluating the relationship between the first and second binary values, hysteresis is also provided to the second binary value.

Applications for these circuits include, for example, control circuits in situations subject to signal noise. Exemplary digital circuits are easily implemented using the digital programmable elements provided in programmable logic devices (PLDs), for example. These circuits can be used, for example, in clocking circuits to compensate for variations in temperature and power supply.

The invention also encompasses related methods of performing equal comparisons between first and second binary values while providing binary hysteresis.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
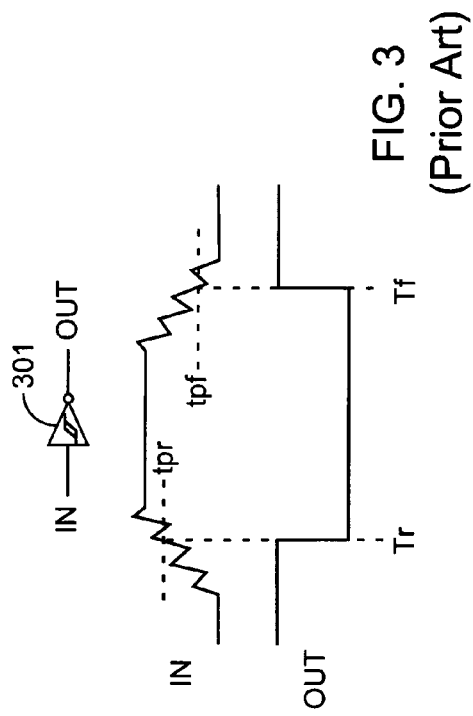
FIG. 3 is a waveform diagram illustrating input and output signals for a Schmitt trigger in a noisy signal environment.
Figure 1:
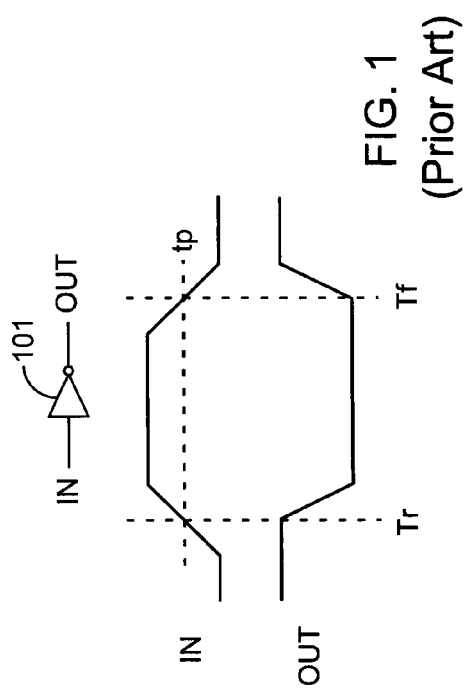
FIG. 1 is a waveform diagram of idealized input and output signals for an inverter.
Figure 2:
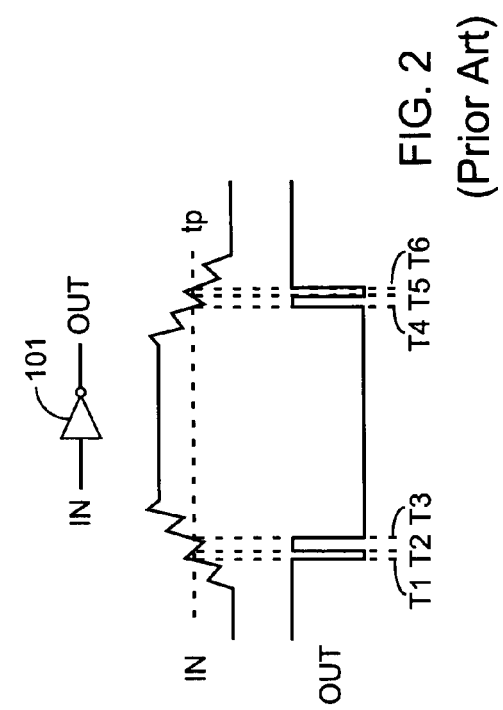
FIG. 2 is a waveform diagram illustrating input and output signals for an inverter in a noisy signal environment.
Figure 4:
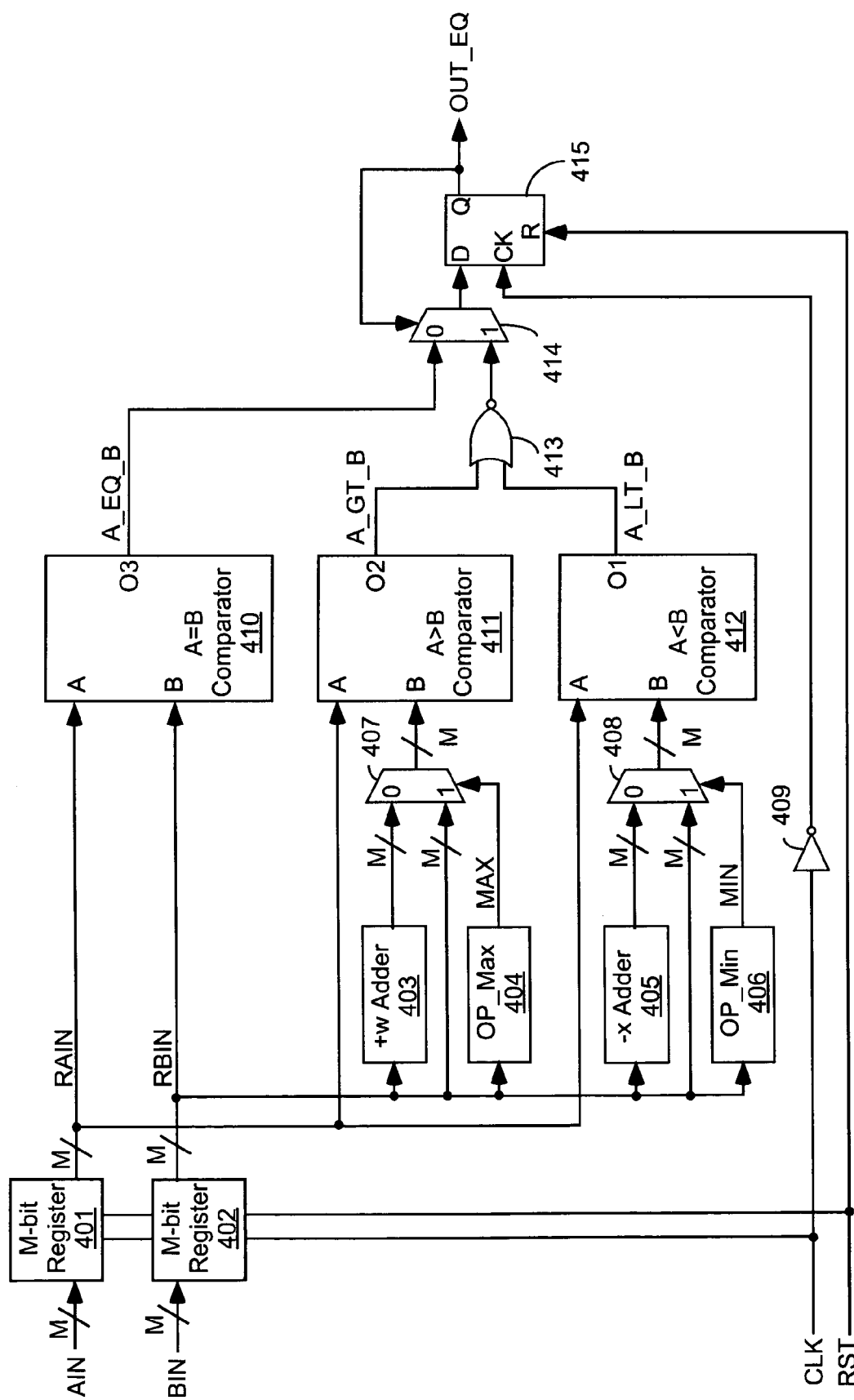
FIG. 4 illustrates a first binary hysteresis equal comparator circuit according to one embodiment of the present invention.

FIG. 4 illustrates a first equal comparator circuit having binary hysteresis, according to one embodiment of the present invention. "Binary hysteresis" differs from "level hysteresis" in that instead of providing two different voltage trip points for the rising and falling edges of an input signal, two different values are used when comparing increasing and decreasing binary values.

The circuit of FIG. 4 includes two registers 401–402, two adder circuits 403 and 405, two overflow prevention circuits 404 and 406, three multiplexer circuits 407–408 and 414, a NOR gate 413, a D-type flip-flop 415, and three comparator circuits 410–412. Because the circuit compares two binary values, the two input signals AIN and BIN are each multi-bit signals. (In the present specification, the same reference characters are used to refer to terminals, signal lines, and their corresponding signals.) In the pictured embodiment, input signals AIN and BIN are each M bits wide, where M is an integer. Similarly, many of the elements in FIG. 4 and the other figures herein represent M-bit-wide circuits, as will be clear to those of skill in the art on perusal of the figures.

M-bit register 401 registers data provided by M-bit input terminal AIN, and provides M-bit signal RAIN. Similarly, M-bit register 402 registers data provided by M-bit input terminal BIN, and provides M-bit signal RBIN. Registers 401–402 are both clocked by signal CLK and reset by signal RST.

"+w" (plus w) adder circuit 403 takes the value of signal RBIN and adds a constant w, providing the resulting value to the "0" data terminal of multiplexer circuit 407. Signal RBIN is also provided to the "1" data terminal of multiplexer circuit 407. Maximum overflow prevention circuit 404 is driven by signal RBIN and provides a single-bit output signal MAX to the select terminal of multiplexer circuit 407. Multiplexer circuit 407 drives the B input terminal of A>B comparator 411, while the A input terminal is driven by signal RAIN. The output terminal of A>B comparator 411 provides signal A_GT_B.

"−x" (minus x) adder circuit 405 (a subtractor) takes the value of signal RBIN and subtracts a constant x, providing the resulting value to the "0" data terminal of multiplexer circuit 408. Signal RBIN is also provided to the "1" data terminal of multiplexer circuit 408. Minimum overflow prevention circuit 406 is driven by signal RBIN and provides a single-bit output signal MIN to the select terminal of multiplexer circuit 408. Multiplexer circuit 408 drives the B input terminal of A<B comparator 412, while the A input terminal is driven by signal RAIN. The output terminal of A<B comparator 412 provides signal A_LT_B.

Signals A_GT_B and A_LT_B are combined in NOR gate 413, which drives the "1" data terminal of multiplexer circuit 414. Signal A_EQ_B is provided to the "0" data terminal of multiplexer circuit 414. Multiplexer circuit 414 drives the data input terminal D of flip-flop 415. Clock signal CLK is inverted by inverter 409 and provided to the clock input terminal CK of flip-flop 415. Reset signal RST is provided to the reset terminal R of flip-flop 415. The output terminal OUT_EQ of flip-flop 415 provides circuit output signal OUT_EQ and is coupled to the select terminal of multiplexer circuit 414.

Broadly speaking, the circuit of FIG. 4 includes three comparator circuits. A first comparator circuit 410 checks for equal values between the registered versions (RAIN and RBIN) of signals AIN and BIN. When the two values of signals RAIN and RBIN are equal, signal A_EQ_B is high; otherwise, signal A_EQ_B is low. A second comparator circuit 411 utilizes a first hysteresis circuit (comprising elements 403–404 and 407) to check for a condition in which signal RAIN is greater than signal RBIN by more than a predetermined constant w. When this condition is satisfied, signal A_GT_B is high; otherwise, signal A_GT_B is low. A third comparator circuit 412 utilizes a second hysteresis circuit (comprising elements 405–406 and 408) to check for a condition in which signal RAIN is less than signal RBIN by more than a predetermined constant x. When this condition is satisfied, signal A_LT_B is high; otherwise, signal A_LT_B is low.

The circuit of FIG. 4 operates as follows. Initially, flip-flop 415 is reset. Thus, signal OUT_EQ is low, and the value of A_EQ_B is passed to the data input terminal D of flip-flop 415. Thus, signal OUT_EQ does not go high until signals RAIN and RBIN are exactly equal (and, in the pictured embodiment, an active edge is received on clock signal CK).

Assume first that signal RAIN increases from the value of RBIN to a value greater than RBIN. Adder circuit 403 adds a value of w to signal RBIN. Therefore, the output of adder circuit 403 is RBIN+w. Signal MAX is high only when adding the constant w to signal RBIN causes adder circuit 403 to exceed the maximum value that can be represented by M bits. When signal MAX is low, multiplexer circuit 407 selects the signal RBIN+w and provides this value to the B input terminal of comparator 411. Thus, signal A_GT_B will go high only when signal RAIN is greater than signal RBIN by a value greater than w.

When signal MAX is high, multiplexer circuit 407 selects the signal RBIN and provides this value to the B input terminal of comparator 411. Thus, as the value of signal RBIN approaches within a value w of the maximum value that can be represented by M bits, signal A_GT_B represents the simple "greater-than" value, without hysteresis.

When signal A_GT_B goes high, NOR gate 413 provides a low value to the "1" data input terminal of multiplexer circuit 414. Because signal OUT_EQ is high, this low value is passed to the data input terminal D of flip-flop 415. At the next active edge of clock signal CK, signal OUT_EQ goes low again.

Secondly, assume that signal RAIN decreases from the value of RBIN to a value less than RBIN. Adder circuit 405 subtracts a value of x from signal RBIN. Therefore, the output of adder circuit 405 is RBIN−x. Signal MIN is high only when subtracting the constant x from signal RBIN causes adder circuit 405 to produce a negative result. When signal MIN is low, multiplexer circuit 408 selects the signal RBIN−x and provides this value to the B input terminal of comparator 412. Thus, signal A_LT_B will go high only when signal RAIN is less than signal RBIN by a value greater than x.

When signal MIN is high, multiplexer circuit 408 selects the signal RBIN and provides this value to the B input terminal of comparator 412. Thus, as the value of signal RBIN approaches within a value x of zero, signal A_LT_B represents the simple "less-than" value, without hysteresis.

When signal A_LT_B goes high, NOR gate 413 provides a low value to the "1" data input terminal of multiplexer circuit 414. Because signal OUT_EQ is high, this low value is passed to the data input terminal D of flip-flop 415. At the next active edge of clock signal CK, signal OUT_EQ goes low again.

Figures 5, 6, 7:
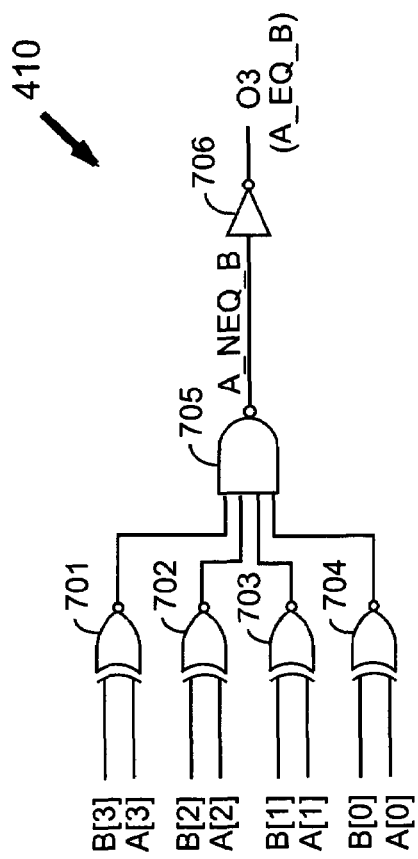
FIG. 5 illustrates an exemplary maximum overflow prevention circuit that can be used in the binary hysteresis comparator circuit of FIG. 4.
FIG. 6 illustrates an exemplary minimum overflow prevention circuit that can be used in the binary hysteresis comparator circuit of FIG. 4.
FIG. 7 illustrates an exemplary A-equals-B comparator circuit that can be used in the binary hysteresis comparator circuit of FIG. 4.

FIG. 5 illustrates an exemplary embodiment of overflow prevention circuit 404 that can be used, for example, in the binary hysteresis comparator circuit of FIG. 4. In the embodiment of FIG. 5, M is four and the constant w is a binary one (0 . . . 01). (In other embodiments, M and/or w have other values.) Thus, signal MAX needs to be high only when adding one to signal RBIN causes adder circuit 403 to roll over from all ones to all zeros. Thus, the circuit of FIG. 5 checks for a value of all ones on signal RBIN. In some embodiments, overflow prevention circuit 404 checks for a value of RBIN equal to a value of ("all ones"−w+1). In other embodiments, overflow prevention circuit 404 checks for a value of RBIN greater than or equal to a value of ("all ones"−w+1).

The circuit of FIG. 5 comprises a NAND gate 501 driving an inverter 502, which provides signal MAX. Signals RBIN[3]–RBIN[0] are provided to the input terminals of NAND-gate 501.

Clearly, the circuit of FIG. 5 can be implemented in many different ways. For example, in another embodiment in which M is four and w is one, the overflow prevention circuit is similar to the circuit of FIG. 5, but with inverter 502 omitted. Signal MAX is replaced by signal MAX_B, which is low when signal RBIN is all ones. Thus, the "0" and "1" data input terminals of multiplexer circuit 407 are reversed.

FIG. 6 illustrates an exemplary embodiment of overflow prevention circuit 406 that can be used, for example, in the binary hysteresis comparator circuit of FIG. 4. In the embodiment of FIG. 6, M is four and the constant x is one. (In other embodiments, M and/or x have other values.) Thus, signal MIN needs to be high only when subtracting one from signal RBIN causes adder circuit 403 to roll over from all zeros to all ones. Thus, the circuit of FIG. 6 checks for a value of all zeros on signal RBIN. In some embodiments, overflow prevention circuit 406 checks for a value of RBIN equal to a value of ("all zeros"+x−1), or (x−1). In other embodiments, overflow prevention circuit 406 checks for a value of RBIN less than or equal to a value of ("all zeros"+x−1), or (x−1).

The circuit of FIG. 6 comprises a NOR gate 601 that provides signal MIN. Signals RBIN[3]–RBIN[0] are provided to the input terminals of NOR-gate 601.

FIG. 7 illustrates an exemplary embodiment of A-equals-B comparator 410 that can be used, for example, in the binary hysteresis comparator circuit of FIG. 4. Note that any appropriate equal comparator can be used to implement circuit 410 in FIG. 4; the implementation shown in FIG. 7 is merely exemplary. In the embodiment of FIG. 7, M is four. The circuit includes XNOR (exclusive NOR) gates 701–704, NAND gate 705, and inverter 706.

Signal A_NEQ_B is provided by NAND gate 705, which is driven by XNOR gates 701–704. Each of XNOR gates 701–704 compares two corresponding bits from the two 4-bit input signals A and B. XNOR gate 701 is driven by signals B[3] and A[3], XNOR gate 702 is driven by signals B[2] and A[2], and so forth. If any pair of corresponding bits includes two different values, the associated XNOR gate provides a low signal to NAND gate 705, and signal A_NEQ_B goes high. Signal A_NEQ_B is inverted by inverter 706 to provide output signal O3 (A_EQ_B).

In another embodiment (not shown), the circuit of FIG. 7 implemented using four XOR gates instead of XNOR gates 701–704. NAND gate 705 is replaced by a NOR gate, while node A_NEQ_B and inverter 706 are omitted.

Figure 8:
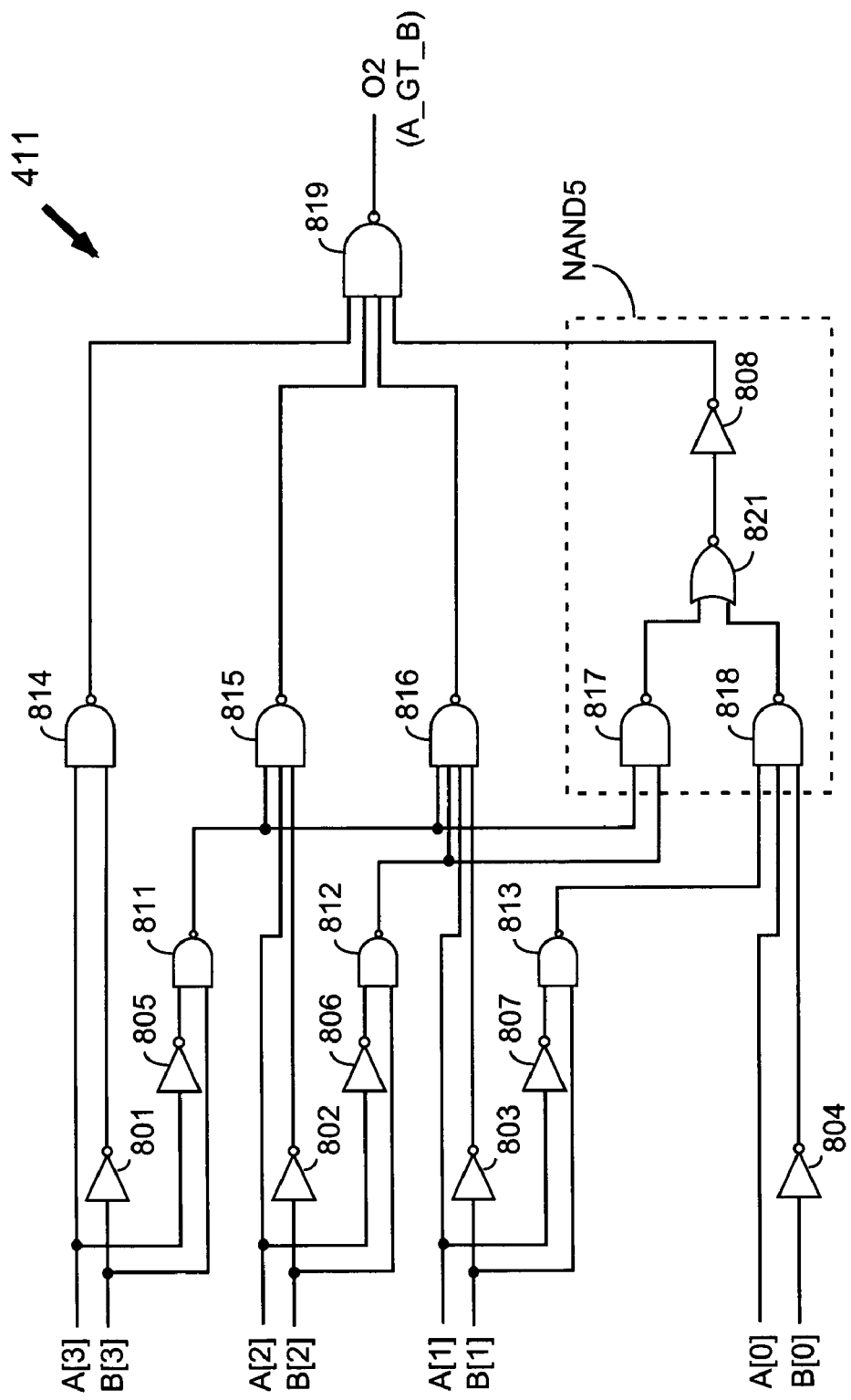
FIG. 8 illustrates an exemplary A-greater-than-B comparator circuit that can be used in the binary hysteresis comparator circuit of FIG. 4.

FIG. 8 illustrates an exemplary embodiment of A-greater-than-B comparator 411 that can be used, for example, in the binary hysteresis equal comparator circuit of FIG. 4. Note that any appropriate greater-than comparator can be used to implement circuit 411 in FIG. 4; the implementation shown in FIG. 8 is merely exemplary. In the embodiment of FIG. 8, M is four. The circuit of FIG. 8 includes inverters 801–808, NAND gates 811–819, and NOR gate 821.

NAND gate 814 is driven by signal A[3], the most significant bit of signal A, and by signal B[3], the most significant bit of signal B, inverted by inverter 801. NAND gate 814 drives NAND gate 819, which provides the comparator output signal O2. Signal O2 (A_GT_B) is high whenever the binary value of signal A is greater than the binary value of signal B.

NAND gate 811 is driven by signal B[3] and by signal A[3] inverted by inverter 805. NAND gate 815 is driven by NAND gate 811, signal A[2], and signal B[2] inverted by inverter 802. NAND gate 815 also drives NAND gate 819.

NAND gate 812 is driven by signal B[2] and by signal A[2] inverted by inverter 806. NAND gate 816 is driven by NAND gate 811, NAND gate 812, signal A[1], and signal B[1] inverted by inverter 803. NAND gate 816 also drives NAND gate 819.

NAND gate 813 is driven by signal B[1] and by signal A[1] inverted by inverter 807. NAND gate 817 is driven by NAND gate 811 and NAND gate 812. NAND gate 818 is driven by NAND gate 813, signal A[0], and signal B[0] inverted by inverter 804. NOR gate 821 is driven by NAND gates 817 and 818, and drives inverter 808, which also drives NAND gate 819. Note that inverter 808, NOR gate 821, and NAND gates 817 and 818 together implement a 5-input NAND gate NAND5.

Figure 9:
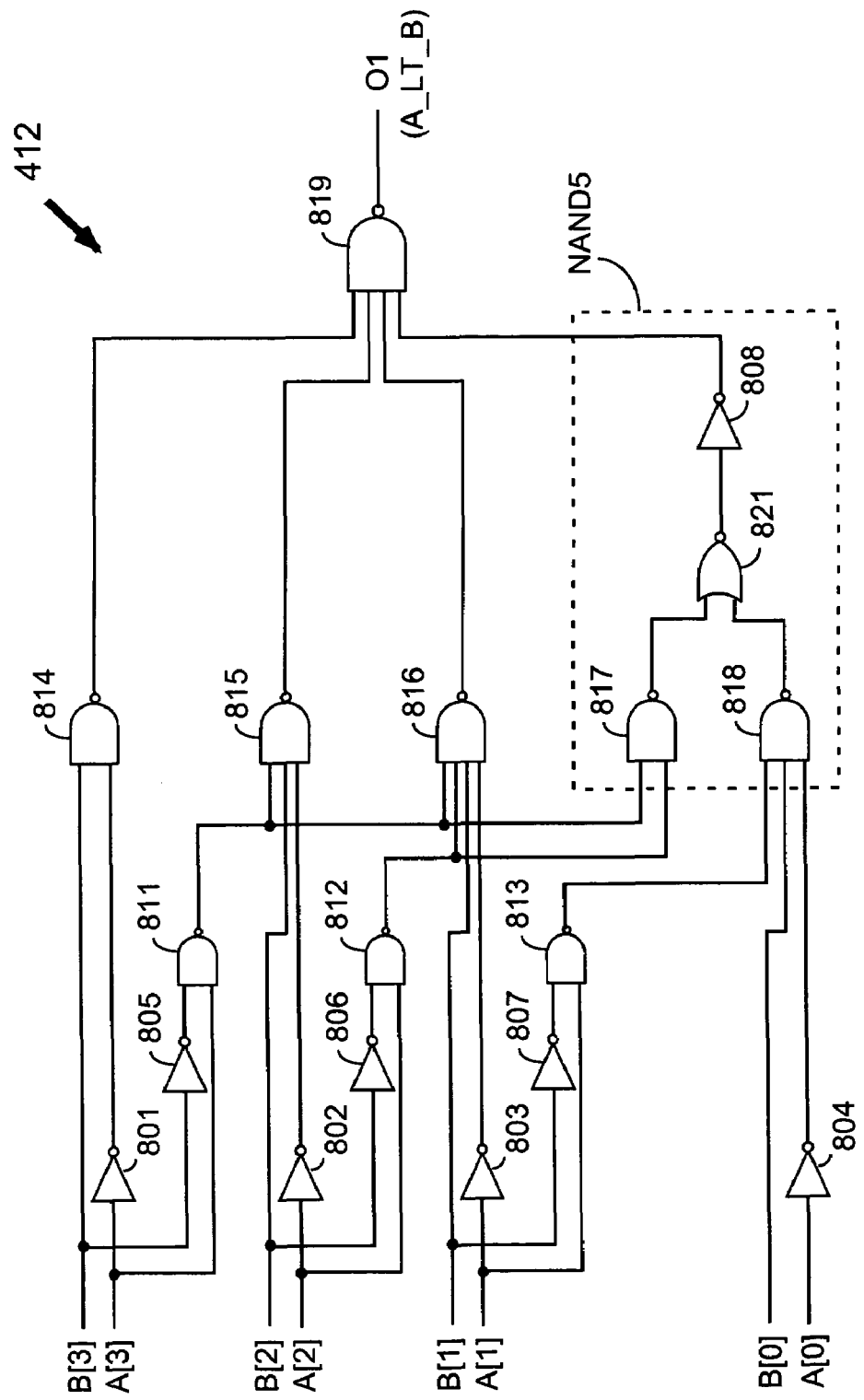
FIG. 9 illustrates an exemplary A-less-than-B comparator circuit that can be used in the binary hysteresis comparator circuit of FIG. 4.

FIG. 9 illustrates an exemplary embodiment of A-less-than-B comparator 412 that can be used, for example, in the binary hysteresis equal comparator circuit of FIG. 4. Note that any appropriate less-than comparator can be used to implement circuit 412 in FIG. 4; the implementation shown in FIG. 9 is merely exemplary. In the embodiment of FIG. 9, M is four. The circuit of FIG. 9 is the same as the circuit of FIG. 8, but with the A and B input signals reversed. Thus, the circuit is not described here. Signal O1 (A_LT_B) is high whenever the binary value of signal A is less than the binary value of signal B.

Figure 10:
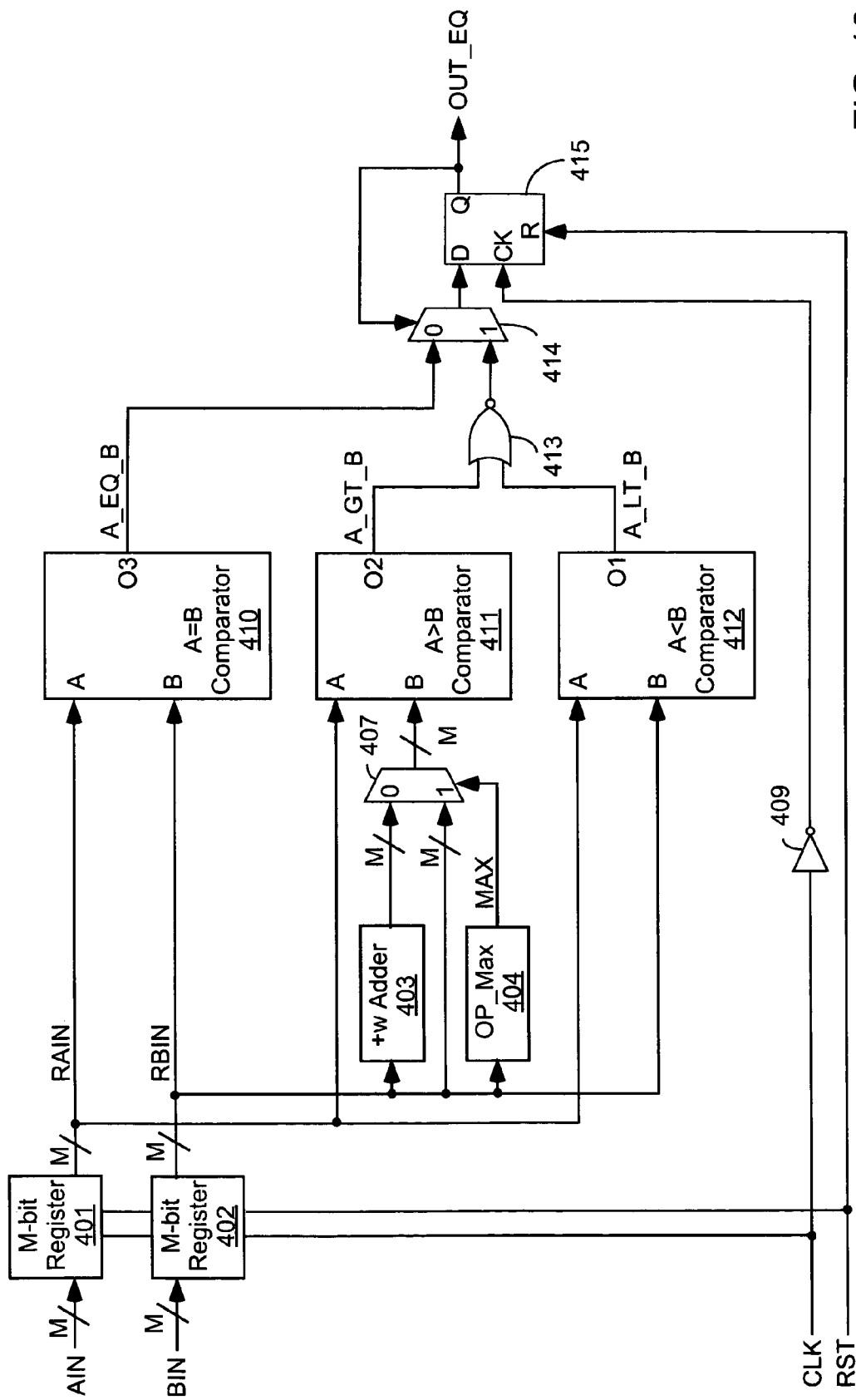
FIG. 10 illustrates a second binary hysteresis equal comparator circuit according to one embodiment of the present invention.

The embodiment of FIG. 4 provides binary hysteresis to signal RAIN whenever RAIN is either increasing or decreasing in value. However, binary hysteresis can also be provided only for increasing values, or only for decreasing values. FIG. 10 illustrates an equal comparator circuit providing binary hysteresis only for values of RAIN that are increasing in value. (Note that the circuit also provides hysteresis for values of RBIN that are decreasing in value.)

The circuit of FIG. 10 is the same as the circuit of FIG. 4, except that adder circuit 405, overflow prevention circuit 406, and multiplexer circuit 408 are removed. Signal RBIN is provided directly to the B input terminal of A-less-than-B comparator 412. Thus, circuit output signal OUT_EQ goes low as soon as signal RAIN decreases to a value less than RBIN. However, signal OUT_EQ does not go low in response to an increasing value for signal RAIN until signal RAIN is greater than signal RBIN by more than constant w.

Figure 11:
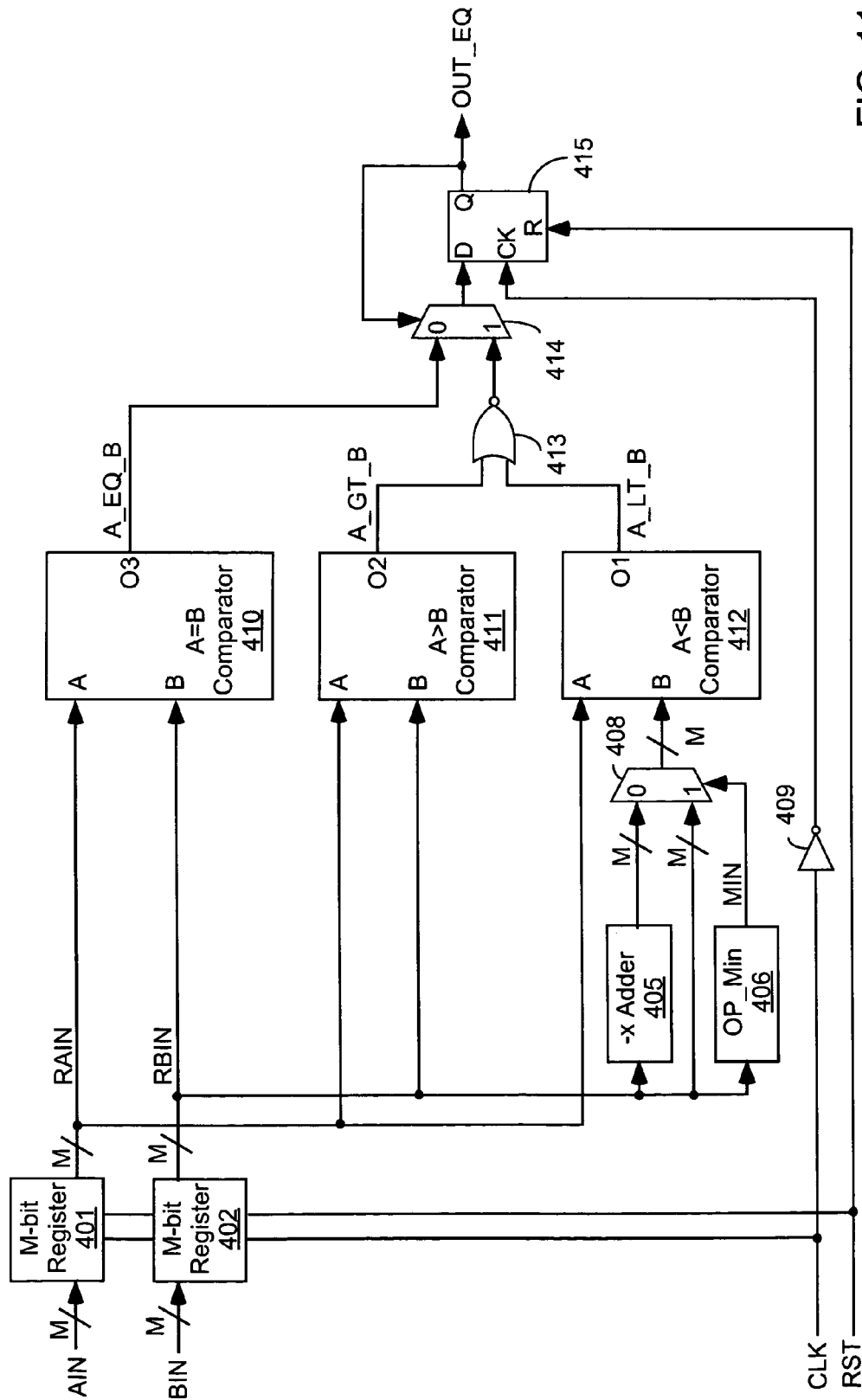
FIG. 11 illustrates a third binary hysteresis equal comparator circuit according to one embodiment of the present invention.

FIG. 11 illustrates an equal comparator circuit providing binary hysteresis only for values of RAIN that are decreasing in value. (Note that the circuit also provides hysteresis for values of RBIN that are increasing in value.) The circuit of FIG. 11 is the same as the circuit of FIG. 4, except that adder circuit 403, overflow prevention circuit 404, and multiplexer circuit 407 are removed. Signal RBIN is provided directly to the B input terminal of A-greater-than-B comparator 411. Thus, circuit output signal OUT_EQ goes low as soon as signal RAIN increases to a value greater than RBIN. However, signal OUT_EQ does not go low in response to an decreasing value for signal RAIN until signal RAIN is less than signal RBIN by more than constant x.

Figure 12:
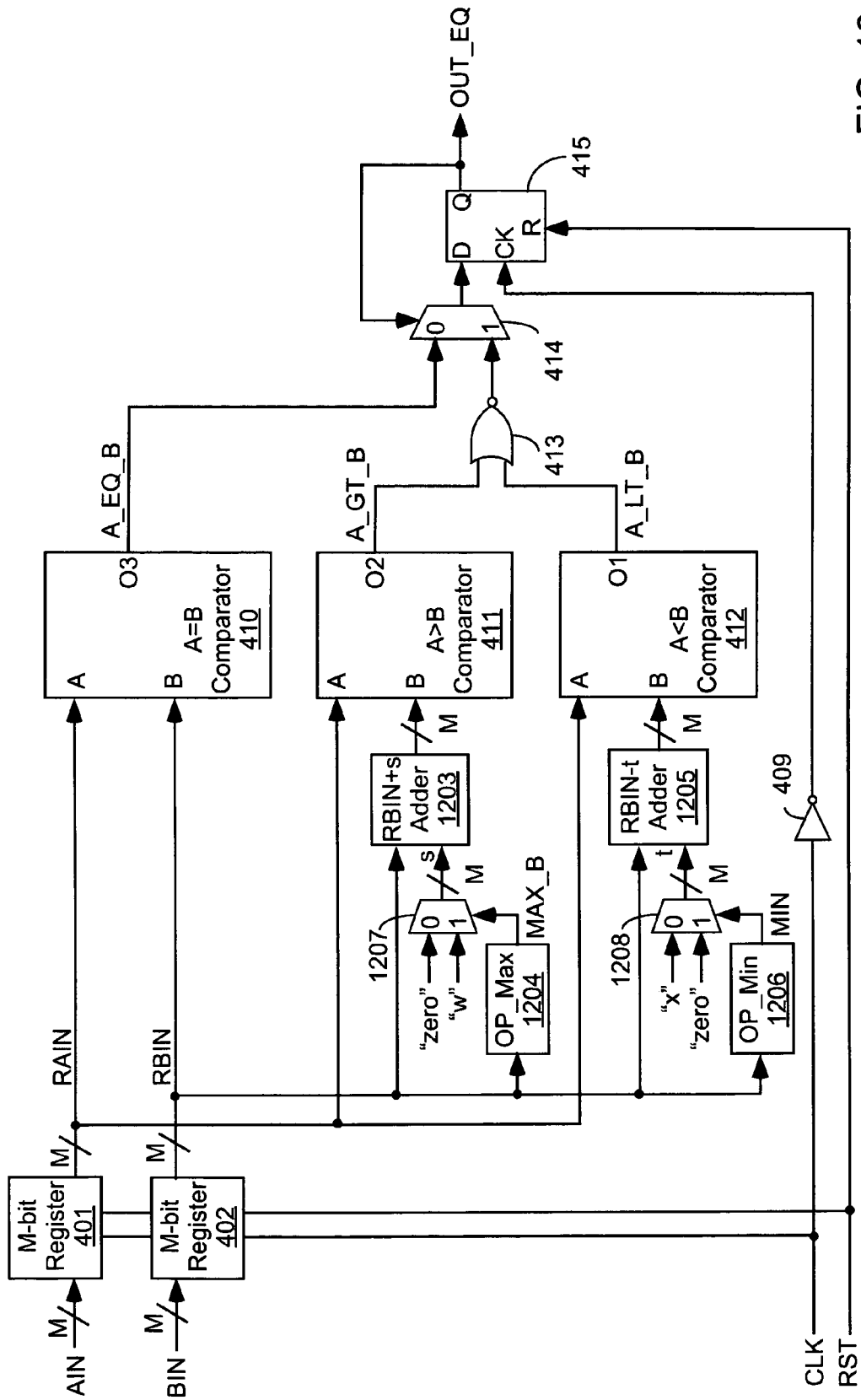
FIG. 12 illustrates a fourth binary hysteresis equal comparator circuit according to one embodiment of the present invention.

FIG. 12 illustrates another binary hysteresis circuit according to another embodiment of the invention. The circuit of FIG. 12 is similar to the circuit of FIG. 4, except that the hysteresis circuits are implemented in a different way. The first hysteresis circuit of FIG. 4 (comprising elements 403–404 and 407), is replaced by a new hysteresis circuit comprising elements 1203–1204 and 1207. The second hysteresis circuit of FIG. 4 (comprising elements 405–406 and 408), is replaced by a new hysteresis circuit comprising elements 1205–1206 and 1208.

The circuit of FIG. 12 operates as follows.

Assume first that signal RAIN increases from the value of RBIN to a value greater than RBIN. Signal MAX_B from overflow prevention circuit 1204 is low only when adding the constant w to signal RBIN causes the result to exceed the maximum value that can be represented by M bits. When signal MAX_B is high, multiplexer circuit 1207 passes the binary constant "w" to the s terminal of adder circuit 1203. Thus, adder circuit 1203 adds "w" to the value of signal RBIN, and passes the resulting signal "RBIN+w" to the B input terminal of comparator 411, as in the embodiment of FIG. 4. When signal MAX_B is low, multiplexer circuit 1207 passes an all-zero value to the s terminal of adder circuit 1203. Thus, adder circuit 1203 adds a "zero" to the value of signal RBIN, and passes the signal "RBIN" to the B input terminal of comparator 411, as in the embodiment of FIG. 4.

Secondly, assume that signal RAIN decreases from the value of RBIN to a value less than RBIN. Signal MIN from overflow prevention circuit 1206 is high only when subtracting the constant x from signal RBIN produces a negative result. When signal MIN is low, multiplexer circuit 1208 passes the binary constant "x" to the t terminal of adder circuit 1205. Thus, adder circuit 1205 subtracts "x" from the value of signal RBIN, and passes the resulting signal "RBIN−x" to the B input terminal of comparator 412, as in the embodiment of FIG. 4. When signal MIN is high, multiplexer circuit 1208 passes an all-zero value to the t terminal of adder circuit 1205. Thus, adder circuit 1205 subtracts a "zero" from the value of signal RBIN, and passes the signal "RBIN" to the B input terminal of comparator 412, as in the embodiment of FIG. 4.

In other embodiments (not shown), one or the other of the hysteresis circuits is omitted from the circuit of FIG. 12.

The figures shown and described herein illustrate a variety of different equal comparator circuits providing binary hysteresis. It will be apparent to one skilled in the art after perusing the present specification and drawings that the present invention can be practiced within these and other architectural variations.

Figure 13:
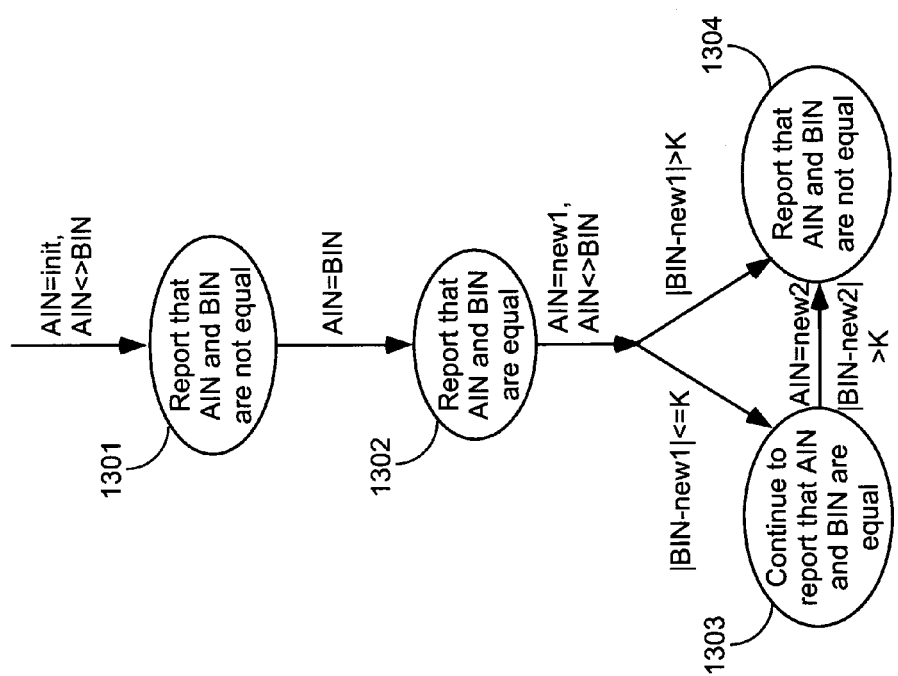
FIG. 13 illustrates the steps of a first exemplary method of performing an equal comparison between first and second binary values while providing binary hysteresis.

FIG. 13 illustrates the steps of an exemplary method of performing an equal comparison between first and second binary values while providing binary hysteresis. These steps can be performed, for example, using the exemplary circuits illustrated in FIGS. 4 and 10–12. However, other circuits can also be used.

In step 1301, signal AIN (a first binary value) has an initial value of "init". Signal BIN (a second binary value) has a different initial value. The circuit implementing the method reports that the first and second binary values are not equal (e.g., signal OUT_EQ is low). The initial value can be either greater than or less than the second binary value.

Signal AIN then assumes a new value, such that signals AIN and BIN are equal. In step 1302, the circuit reports that the first and second binary values are equal (e.g., signal OUT_EQ goes high).

Signal AIN then assumes a first new value ("new1"), where the first new value differs from the second binary value by a value less than or equal to (i.e., not exceeding) a predetermined constant K (e.g., w or x in the exemplary circuits illustrated herein). The first new value can be either greater than or less than the second binary value. Instead of reporting that the two signals are not equal, in step 1303 the circuit continues to report that the first and second binary values are equal (e.g., signal OUT_EQ remains high).

Eventually, the first binary value assumes a second new value ("new2") differing from the second binary value by a number exceeding the predetermined constant K. In step 1304, the circuit reports that the first and second binary values are not equal, e.g., signal OUT_EQ goes low again.

Figure 14:
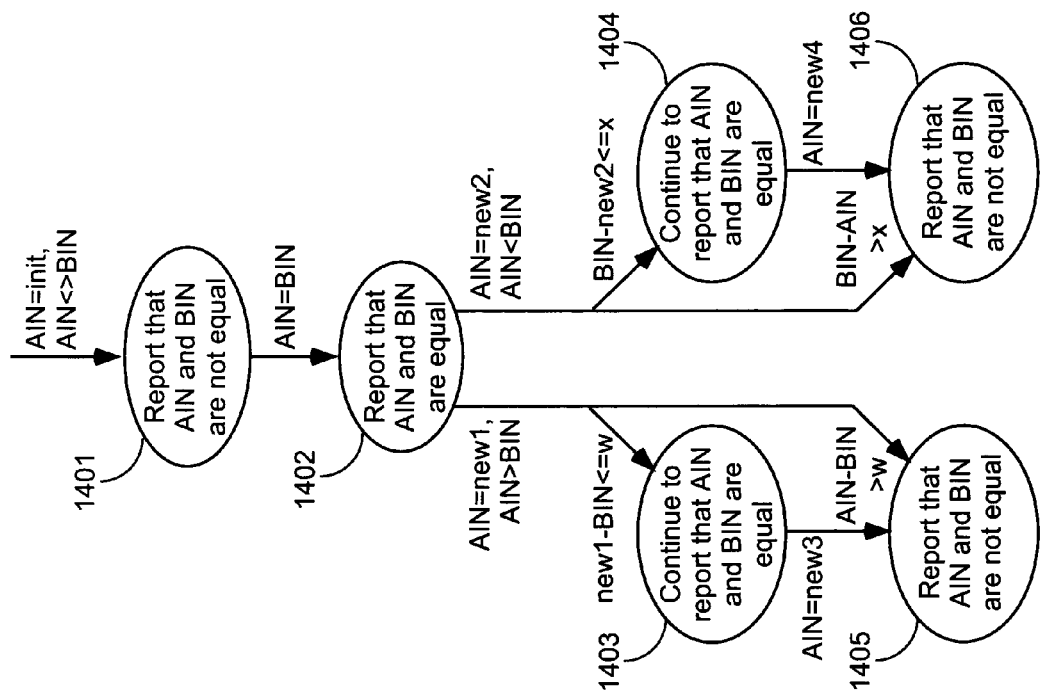
FIG. 14 illustrates the steps of a second exemplary method of performing an equal comparison between first and second binary values while providing binary hysteresis.

FIG. 14 illustrates the steps of another exemplary method of performing an equal comparison between first and second binary values while providing binary hysteresis. These steps can be performed, for example, using the exemplary circuits illustrated in FIGS. 4 and 10–12. However, other circuits can also be used.

In step 1401, signal AIN (a first binary value) has an initial value of "init". Signal BIN (a second binary value) has a different initial value. The circuit implementing the method reports that the first and second binary values are not equal (e.g., signal OUT_EQ is low). The initial value can be either greater than or less than the second binary value.

Signal AIN then assumes a new value, such that signals AIN and BIN are equal. In step 1402, the circuit reports that the first and second binary values are equal, (e.g., signal OUT_EQ goes high).

In a first scenario, signal AIN then assumes a first new value ("new1"). The first new value is greater than the second binary value by a value less than or equal to (i.e., not exceeding) a predetermined constant (e.g., w in the exemplary circuits illustrated herein). Instead of reporting that the two signals are not equal, in step 1403 the circuit continues to report that the first and second binary values are equal. Eventually, the first binary value assumes another new value ("new3") greater than the second binary value by a number exceeding the constant w. In step 1405, the circuit reports that the first and second binary values are not equal.

In a second scenario, after step 1402 signal AIN assumes a second new value ("new2"). The second new value is less than the second binary value by a value less than or equal to (i.e., not exceeding) a predetermined constant (e.g., x in the exemplary circuits illustrated herein). Instead of reporting that the two signals are not equal, in step 1404 the circuit continues to report that the first and second binary values are equal. Eventually, the first binary value assumes another new value ("new4") less than the second binary value by a number exceeding the constant x. In step 1406, the circuit reports that the first and second binary values are not equal.

Those having skill in the relevant arts of the invention will now perceive various modifications and additions that can be made as a result of the disclosure herein. For example, comparator circuits, comparators, A-equals-B comparators, A-greater-than-B comparators, A-less-than-B comparators, multiplexer circuits, adder circuits, adders, subtractors, overflow prevention circuits, registers, memory elements, flip-flops, inverters, NAND- and NOR-gates, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A binary hysteresis comparator circuit, comprising:
    first and second multi-bit circuit input terminals;
    a circuit output terminal;
    an A-equals-B comparator having a multi-bit A input terminal coupled to the first circuit input terminal, a multi-bit B input terminal coupled to the second circuit input terminal, and an output terminal;
    an A-greater-than-B comparator having a multi-bit A input terminal coupled to the first circuit input terminal, a multi-bit B input terminal, and an output terminal;
    an A-less-than-B comparator having a multi-bit A input terminal coupled to the first circuit input terminal, a multi-bit B input terminal, and an output terminal;
    a logic gate having a first input terminal coupled to the output terminal of the A-greater-than-B comparator, a second input terminal coupled to the output terminal of the A-less-than-B comparator, and an output terminal;
    a first multiplexer circuit having a first data input terminal coupled to the output terminal of the A-equals-B comparator, a second data input terminal coupled to the output terminal of the logic gate, a select terminal, and an output terminal;
    a memory element having a data input terminal coupled to the output terminal of the first multiplexer circuit, and further having a data output terminal coupled to the circuit output terminal and to the select terminal of the first multiplexer circuit; and
    a first hysteresis circuit coupled between the second circuit input terminal and the B input terminal of one of the A-greater-than-B comparator and the A-less-than-B comparator.

2. The binary hysteresis comparator circuit of claim 1, wherein the first hysteresis circuit comprises:
    an adder circuit having a multi-bit input terminal coupled to the second circuit input terminal and further having a multi-bit output terminal;
    a second multiplexer circuit having a first multi-bit data input terminal coupled to the output terminal of the adder circuit, a second multi-bit data input terminal coupled to the second circuit input terminal, a select terminal, and a multi-bit output terminal coupled to the B input terminal of the one of the A-greater-than-B comparator and the A-less-than-B comparator; and
    an overflow prevention circuit coupled between the second circuit input terminal and the select terminal of the second multiplexer circuit.

3. The binary hysteresis comparator circuit of claim 2, wherein the one of the A-greater-than-B comparator and the A-less-than-B comparator comprises the A-greater-than-B comparator, and the adder circuit comprises an adder, wherein the adder adds a first constant to a value on the second circuit input terminal.

4. The binary hysteresis comparator circuit of claim 3, wherein the first constant is a binary one.

5. The binary hysteresis comparator circuit of claim 2, wherein the one of the A-greater-than-B comparator and the A-less-than-B comparator comprises the A-less-than-B comparator, and the adder circuit comprises a subtractor, wherein the subtractor subtracts a second constant from a value on the second circuit input terminal.

6. The binary hysteresis comparator circuit of claim 5, wherein the second constant is a binary one.

7. The binary hysteresis comparator circuit of claim 1, wherein the first hysteresis circuit comprises:
    a second multiplexer circuit having a first multi-bit data input terminal coupled to receive an all-zero value, a second multi-bit data input terminal coupled to receive a constant, a select terminal, and a multi-bit output terminal;
    an adder circuit having a first multi-bit input terminal coupled to the second circuit input terminal, a second multi-bit terminal coupled to the output terminal of the second multiplexer circuit, and a multi-bit output terminal coupled to the B input terminal of the one of the A-greater-than-B comparator and the A-less-than-B comparator; and
    a first overflow prevention circuit coupled between the second circuit input terminal and the select terminal of the second multiplexer circuit.

8. The binary hysteresis comparator circuit of claim 7, wherein the constant is a binary one.

9. The binary hysteresis comparator circuit of claim 7, wherein the one of the A-greater-than-B comparator and the A-less-than-B comparator comprises the A-greater-than-B comparator, and the adder circuit comprises an adder, wherein the adder adds a value provided by the second multiplexer circuit to a value on the second circuit input terminal.

10. The binary hysteresis comparator circuit of claim 7, wherein the one of the A-greater-than-B comparator and the A-less-than-B comparator comprises the A-less-than-B comparator, and the adder circuit comprises a subtractor, wherein the subtractor subtracts a value provided by the second multiplexer circuit from a value on the second circuit input terminal.

11. The binary hysteresis comparator circuit of claim 1, further comprising:
   a second hysteresis circuit coupled between the second circuit input terminal and the B input terminal of another of the A-greater-than-B comparator and the A-less-than-B comparator.

12. The binary hysteresis comparator circuit of claim 11, wherein each of the first and second hysteresis circuits comprises:
   an adder circuit having a multi-bit input terminal coupled to the second circuit input terminal and further having a multi-bit output terminal;
   a second multiplexer circuit having a first multi-bit data input terminal coupled to the output terminal of the adder circuit, a second multi-bit data input terminal coupled to the second circuit input terminal, a select terminal, and a multi-bit output terminal coupled to the B input terminal of the one of the A-greater-than-B comparator and the A-less-than-B comparator; and
   an overflow prevention circuit coupled between the second circuit input terminal and the select terminal of the second multiplexer circuit.

13. The binary hysteresis comparator circuit of claim 12, wherein:
   in the first hysteresis circuit, the adder circuit is an adder and the output terminal of the second multiplexer circuit is coupled to the B input terminal of the A-greater-than-B comparator, wherein the adder adds a first constant to a value on the second circuit input terminal; and
   in the second hysteresis circuit, the adder circuit is a subtractor and the output terminal of the second multiplexer circuit is coupled to the B input terminal of the A-less-than-B comparator, wherein the subtractor subtracts a second constant from the value on the second circuit input terminal.

14. The binary hysteresis comparator circuit of claim 13, wherein the first and second constants are the same.

15. The binary hysteresis comparator circuit of claim 14, wherein the first and second constants are both binary ones.

16. The binary hysteresis comparator circuit of claim 11, wherein each of the first and second hysteresis circuits comprises:
   a second multiplexer circuit having a first multi-bit data input terminal coupled to receive an all-zero value, a second multi-bit data input terminal coupled to receive a constant, a select terminal, and a multi-bit output terminal;
   an adder circuit having a first multi-bit input terminal coupled to the second circuit input terminal, a second multi-bit terminal coupled to the output terminal of the second multiplexer circuit, and a multi-bit output terminal coupled to the B input terminal of the one of the A-greater-than-B comparator and the A-less-than-B comparator; and
   an overflow prevention circuit coupled between the second circuit input terminal and the select terminal of the second multiplexer circuit.

17. The binary hysteresis comparator circuit of claim 16, wherein:
   in the first hysteresis circuit, the adder circuit is an adder and the output terminal of the adder circuit is coupled to the B input terminal of the A-greater-than-B comparator, wherein the adder adds a value provided by the second multiplexer circuit to a value on the second circuit input terminal; and
   in the second hysteresis circuit, the adder circuit is a subtractor and the output terminal of the adder circuit is coupled to the B input terminal of the A-less-than-B comparator, wherein the subtractor subtracts the value provided by the second multiplexer circuit from the value on the second circuit input terminal.

18. The binary hysteresis comparator circuit of claim 16, wherein in each of the first and second hysteresis circuits the constants are equal.

19. The binary hysteresis comparator circuit of claim 18, wherein in each of the first and second hysteresis circuits the constant is a binary one.

20. The binary hysteresis comparator circuit of claim 1, wherein the logic gate is a logical NOR gate.

21. The binary hysteresis comparator circuit of claim 1, wherein the memory element is a D-type flip-flop.

22. The binary hysteresis comparator circuit of claim 1, further comprising:
   a first multi-bit register coupled between the first circuit input terminal and the A input terminals of the A-equals-B comparator, the A-greater-than-B comparator, and the A-less-than-B comparator, the first register having a clock input terminal; and
   a second multi-bit register coupled between the second circuit input terminal and the B input terminals of the A-equals-B comparator, the A-greater-than-B comparator, and the A-less-than-comparator, the second register having a clock input terminal,
   wherein the memory element comprises a clock input terminal coupled to the clock input terminals of the first and second registers.

23. The binary hysteresis comparator circuit of claim 22, further comprising an inverting logic gate coupled between the clock input terminals of the first and second registers and the clock input terminal of the memory element.

24. The binary hysteresis comparator circuit of claim 22, wherein the first and second registers and the memory element each comprise a reset input terminal, and the reset input terminals of the first and second registers and the memory element are all coupled one to another.

25. A method of performing an equal comparison between first and second binary values while providing binary hysteresis, the method comprising:
   reporting, when the first binary value has an initial value not equal to the second binary value, that the first and second binary values are not equal;
   reporting, when the first binary value assumes a value equal to the second binary value, that the first and second binary values are equal; and
   continuing to report, when the first binary input value assumes a first new value, that the first and second binary values are equal,
   wherein the first new value differs from the second binary value by a number not exceeding a predetermined constant.

26. The method of claim 25, wherein the first new value is greater than the second binary value by the number.

27. The method of claim 25, wherein the first new value is less than the second binary value by the number.

28. The method of claim 25, further comprising:
reporting, when the first binary value assumes a second new value differing from the second binary value by a number exceeding the predetermined constant, that the first and second binary values are not equal.

29. The method of claim 25, wherein the predetermined constant is a binary one.

30. A binary hysteresis comparator circuit performing an equal comparison between first and second binary values while providing binary hysteresis, the circuit comprising:
means for reporting, when the first binary value has an initial value not equal to the second binary value, that the first and second binary values are not equal;
means for reporting, when the first binary value assumes a value equal to the second binary value, that the first and second binary values are equal; and
means for continuing to report, when the first binary input value assumes a new value, that the first and second binary values are equal,
wherein the new value differs from the second binary value by a number not exceeding a predetermined constant.

31. The circuit of claim 30, wherein the new value is greater than the second binary value by the number.

32. The circuit of claim 30, wherein the new value is less than the second binary value by the number.

33. The circuit of claim 30, wherein the predetermined constant is a binary one.

34. A method of performing an equal comparison between first and second binary values while providing binary hysteresis, the method comprising:
reporting, when the first binary value has an initial value not equal to the second binary value, that the first and second binary values are not equal;
reporting, when the first binary value assumes a value equal to the second binary value, that the first and second binary values are equal;
continuing to report, when the first binary input value increases to a first new value, that the first and second binary values are equal, wherein the first new value is greater than the second binary value by a first number not exceeding a first predetermined constant; and
continuing to report, when the first binary input value decreases to a second new value, that the first and second binary values are equal, wherein the second new value is less than the second binary value by a second number not exceeding a second predetermined constant.

35. The method of claim 34, wherein the first and second predetermined constants are the same.

36. The method of claim 35, wherein the first and second predetermined constants are binary ones.

37. The method of claim 34, further comprising:
reporting, when the first binary input value increases to a third new value greater than the second binary value by a third number exceeding the first predetermined constant, that the first and second binary values are not equal.

38. The method of claim 34, further comprising:
reporting, when the first binary input value decreases to a fourth new value less than the second binary value by a fourth number exceeding the second predetermined constant, that the first and second binary values are not equal.

39. A binary hysteresis comparator circuit performing an equal comparison between first and second binary values while providing binary hysteresis, the circuit comprising:
means for reporting, when the first binary value has an initial value not equal to the second binary value, that the first and second binary values are not equal;
means for reporting, when the first binary value assumes a value equal to the second binary value, that the first and second binary values are equal;
means for continuing to report, when the first binary input value increases to a first new value, that the first and second binary values are equal, wherein the first new value is greater than the second binary value by a first number not exceeding a first predetermined constant; and
means for continuing to report, when the first binary input value decreases to a second new value, that the first and second binary values are equal, wherein the second new value is less than the second binary value by a second number not exceeding a second predetermined constant.

40. The circuit of claim 39, wherein the first and second predetermined constants are the same.

41. The circuit of claim 40, wherein the first and second predetermined constants are binary ones.

* * * * *